United States Patent [19]

Tarng et al.

[11] Patent Number: 4,520,312
[45] Date of Patent: May 28, 1985

[54] METHOD FOR DETERMINING THE INTEGRITY OF PASSIVANT COVERAGE OVER RECTIFYING JUNCTIONS IN SEMICONDUCTOR DEVICES

[75] Inventors: Ming L. Tarng, San Diego, Calif.; William S. Romito, Somerset, N.J.

[73] Assignee: RCA Corporation, Princeton, N.J.

[21] Appl. No.: 438,931

[22] Filed: Nov. 3, 1982

[51] Int. Cl.$^3$ .................. G01R 31/21; G01R 31/02
[52] U.S. Cl. ........................ 324/158 D; 324/158 F
[58] Field of Search ........... 324/158 D, 158 F, 158 R, 324/158 T

[56] References Cited

U.S. PATENT DOCUMENTS

| | | | |
|---|---|---|---|
| 3,710,251 | 1/1973 | Hagge et al. | 324/158 F |
| 3,949,295 | 4/1976 | Moorshead | 324/158 F |
| 4,344,985 | 8/1982 | Goodman et al. | 427/85 |

OTHER PUBLICATIONS

"New Technologies Advance Power Semiconductor State-Of-The-Art" by R. Denning and J. White, RCA Technical Communications, 1979, pp. 66-72.
"Handbook of Thin Film Technology" edited by Leon I. Maissel and Reinhard Glang, 1970, pp. 11-42 through 11-47.

Primary Examiner—Ernest F. Karlsen
Attorney, Agent, or Firm—Birgit E. Morris; Donald S. Cohen; Joseph D. Lazar

[57] ABSTRACT

A semiconductor device having a rectifying junction after passivation is exposed to a humid ambient while being tested for humidity-induced leakage currents indicative of passivant defects such as pinholes, cracks, etc. The amplitude of the reverse biased humidity-induced current is indicative of the integrity of the passivant coverage.

8 Claims, 4 Drawing Figures

METHOD FOR DETERMINING THE INTEGRITY OF PASSIVANT COVERAGE OVER RECTIFYING JUNCTIONS IN SEMICONDUCTOR DEVICES

This invention relates to a method of testing semiconductor devices and more particularly to a method for testing for the integrity of passivant coverage over rectifying junctions in semiconductor devices.

One of the common problems in the passivation of semiconductor devices is the integrity of the coverage of the passivant near the rectifying junctions. This problem is especially serious for so-called mesa-type semiconductor devices. Optical microscopy and other defect determining methods often do not resolve coverage defects existing near the vertical wall portions of the mesa at which the rectifying junction is exposed. Scanning electron microscopy (SEM) can show defects in such passivant coverages much better than other techniques, but the use of SEM is slow, costly and indeed, destructive. More importantly, all the techniques known in the art lack direct correlation between the coverage defects and the current-voltage (I-V) characteristics, since not all coverage defects will result in unacceptable leakage current levels. Indeed, many of the prior art methods depend on the subjective judgment of the tester.

SUMMARY OF THE INVENTION

The invention provides for a method for determining the integrity of passivant coverage over rectifying junctions of a semiconductor device manifested by humidity-induced leakage current, comprising the steps of passivating the junctions of a semiconductor device, determining the current flow through the device in a dry environment, exposing the surface of the semiconductor device to an environment of predetermined humidity and determining the current flow changes with changes in the humidity manifesting thereby the integrity of the passivant on the device.

DETAILED DESCRIPTION OF THE PREFERRED EMBODIMENT

The detailed description of the embodiment of the invention to follow shall make reference to the drawing in which.

It is known that the junction leakage across the rectifying junction of a semiconductor device is a sensitive function of ambient humidity. We have discovered that the sensitivity of the leakage current to humidity variations is also a strong function of the passivant coverage at the vicinity of the rectifying junction at which good passivant coverage is of most critical importance. One can, therefore, measure the change in leakage current, at a fixed bias, as a function of humidity and use the current change as a criterion for acceptance or rejection of a device. We, thus, use humidity-induced reverse bias current measurements as the indication of the integrity of a passivant as will now be described in detail.

Figure 1:
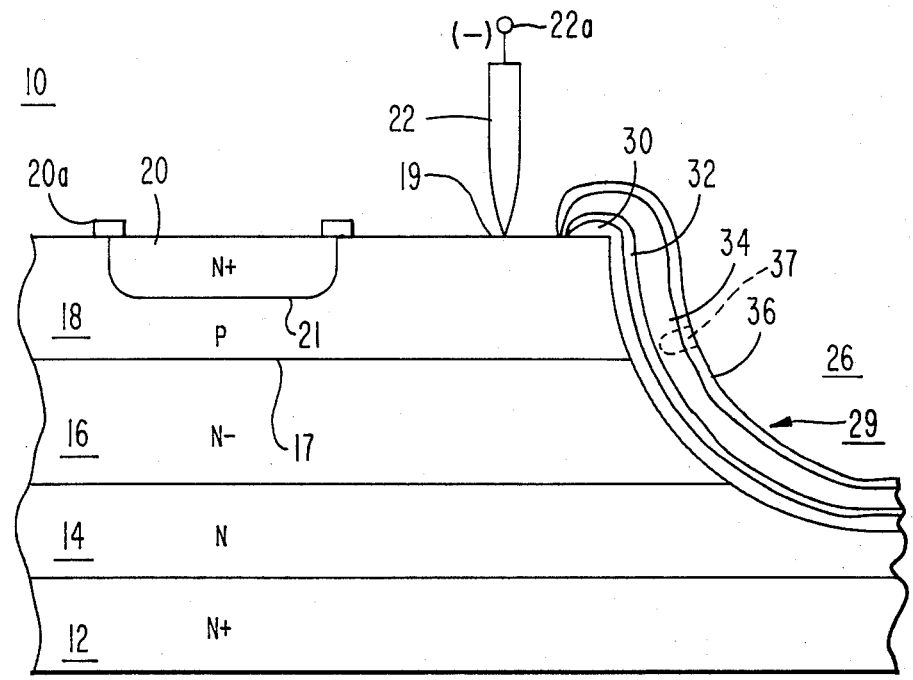
FIG. 1 is a schematic of a mesa-type bipolar transistor device illustrating one device useful in practicing the invention.

An example of where the difficulty occurs in semiconductor device processing can be illustrated in the use of a mesa-type bipolar transistor as illustrated in FIG. 1 as a fragmentary portion of one transistor being formed on a wafer of many such transistors. The device 10 is formed of a plurality of layers of suitably doped N and P-type layers, for example, as shown. An N layer 14 is deposited oven an N+ silicon substrate 12. An N− layer 16, serving as a collector, is deposited over layer 14. A P layer 18 is then deposited on layer 16, layer 18 serving as the base of the device. A rectifying junction 17 is defined at the interface of layer 18 and layer 16. A rectifying junction 21 is established to the base 18 by means of region 20, formed of N+ material. Region 20 serves as the emitter of the transistor. A passivant 20a, such as $SiO_2$ is applied over the junction of emitter region 20. A mesa well 26 is formed into the layers 14-18. The well 26 is used for junction termination and passivation to separate each individual transistor from the others of the wafer in a known manner.

A tungsten probe 22 is suitably positioned on a surface region of the transistor near the mesa well 26, the region being identified, for convenience, as surface region 19. Probe 22 is connected to terminal 22a for connection to a circuit to be described in connection with FIG. 2.

One or more layers of a passivant 29 is provided over the wall of mesa well 26. A preferred passivant is of the type known as SOGO. See the following documents for detailed descriptions of SIPOS and SOGO passivation systems: U.S. Pat. No. 4,344,985, issued Aug. 17, 1982 and the article by R. Denning and J. White, entitled "New Technologies Advance Power Semiconductor State-Of-The-Art," RCA Technical Communications, 1979, pp 66–72, particularly pp 69–70. The SOGO miltilayer passivation system, as used to illustrate the present embodiment, is formed essentially for four layers 30, 32, 34, and 36, respectively. Layer 30 is a semi-insulating polycrystalline oxygen doped silicon, also known as "SIPOS." This layer is typically 0.5 micrometers thick. Layer 32 is a layer of silicon oxide that is deposited in a CVD process at low temperatures to a thickness of about 0.8 micrometers. Layer 34 is a layer of glass that is usually spun on the surface by any convenient method known in the art. The glass layer 34 is typically formed from a frit glass in a vehicle of photoresist material forming together a slurry about 20–50 micrometers thick. Atop the glass layer 34 is provided a final layer 36 of low temperature silicon dioxide, typically 1 micrometers thick.

As well known in the art, poor glass coverage of layer 34 near the junction region of the mesa well 26 are at times catastrophic and often result in "jittery" breakdown characteristics which eventually result in device failure after repeated high voltage stress. Poor glass coverage is typically manifested as pinholes, thin portions and bare spots in the glass caused by gas bubbles and surface tension during fusing and melting of the frit glass. Discovery and screening of these catastrophic pinholes and bare spots are often difficult, destructive, or subjective. Moreover, an ordinary probe test is not sufficiently sensitive to detect the potential glass coverage problem.

We have discovered that the current leakage level becomes more sensitive to the degree of perfection in glass coverage as the relative humidity of the probe test measurement ambient is increased. This is so because a large surface field exists when the glass layer 34 is thin or non-existent. Such an increased field, in turn, induces increased leakage currents when the surface is wet or relative humidity is high. Thus, one can detect easily the existence of poor glass coverage by probe-testing the devide leakage current under a relative humidity-controlled ambient.

Figure 2:
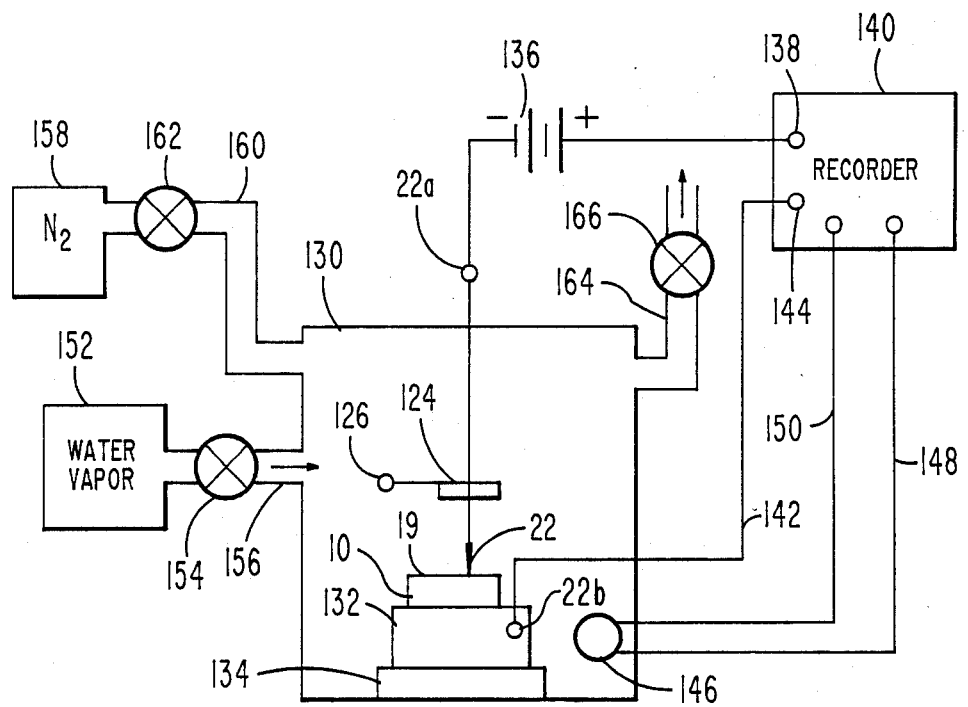
FIG. 2 is a block schematic of a test environment for measuring the leakage current in the device illustrated in FIG. 1.

Reference is made to FIG. 2 showing a simplified schematic of a test set-up for determining leakage current across a transistor device in the presence of a controlled ambient of relative humidity. The chamber 130 provides a means to test the device 10 which is supported on a metallic support 132. Support 132 may be simply a nickel-plates brass plate, or, if desired, a conductive vacuum chuck for holding the device 10 in position. Accordingly, the chamber 130 could be used as one step of an automated process and chamber 130 would thus serve as an automatic wafer probe station for determining the leakage of the device at that stage of the overall semiconductor manufacturing process.

Support 132 is then supported on an insulated block 134 of a insulating material. Probe 22, as described above concerning FIG. 1, is supported within the chamber by a bracket 124 suitably attached to a fixed structure 126 within the chamber to hold the probe 22 in position and to apply suitable pressure as required to the surface 19 of the layer 18 of device 10. Probe 22 is connected to a battery 136 by a wire via terminal 22a which, in turn is connected to a terminal 138 of a recorder 140. Recorder 140 serves as a meter or display of the current flowing through the device. A CRT or other instruments known in the art can be used instead of a recorder if desired. The metallic support 132 is connected via terminal 22b by wire 142 to a terminal 144 of recorder 140. A humidity sensor 146 is connected by wires 148 and 150 to recorder 140 to provide an input signal to the recorder indicative of the percent relative humidity within chamber 130.

The ambient of chamber 130 is arranged initially to be dry and thereafter provided with water vapor from a source 152 and a valve 154 to opening 156. A drying agent such as nitrogan is provided from a source of nitrogen 158 and carried to the chamber 130 via conduit 160 under control of valve 162. Water vapor source 152 is a source of water vapor providing moisture at any desired percent of relative humidity. We have found that a conventional atomizer or spray vaporizer, used, e.g., for perfumery, which responds to manual operation of an air pressure bulb, can be used to effect a spray of moisture into the chamber. For a chamber of about 1 cubic foot, such a spray vaporizer can provide moisture at nearly 100 percent relative humidity. Moisture at substantially 100 percent is recommended in certain testing applications for making a determination of leakage current through a rectifying junction. We have discovered that in practice a substantially high relative humidity approaching 100 percent, as would be generated by such a simple moisturizer, is adequate for determining the leakage across a rectifying junction to test the integrity of the passivant coverage during the device fabrication process.

Exhaust line 164 is provided with a valve 166 and suitable venting fans (not shown) for exhausting the chamber 130. Thus, chamber 130 can be rendered substantially dry by pumping into it nitrogen from source 158 while the vapor valve 154 is closed and exhausting from the chamber all the moisture, etc. that may remain with valve 166 open. Nitrogen is known to serve as a very good drying agent, and is preferred for this embodiment.

In operation with the battery voltage 136 at a predetermined bias voltage to effect a reverse bias across junction 17, and probe 22 in place over region 19 of the device 20, recorder 140 can provide a plot of the humidity-induced current changes as the percent relative humidity at the inlet conduit 156 is changed. The steps of determining the integrity of a passivant are as follows: The device 10 to be tested is assumed to have already passed tests for operability prior to passivation. The device 10 it should be understood is only one such device of many devices on a wafer. Moreover, a sample test of only one device, as typical in the art of testing, is done to determine the passivant integrity of all the devices on the same wafer. The device 10 is then passivated as described above and placed in operable position in chamber 130. The battery voltage 136 is selected at a value of least at 80% and preferably at 100% of the rated bias voltage for the device. Other bias voltage values may be used as desired. For example, some testing procedures may use 80% of the rated voltage but with the temperature of the chamber much higher, e.g., 150° C., than typical ambient temperatures.

The chamber 130 is initially a dry environment as by the use of nitrogen via conduit 160. The current is measured by recorder 140. A measurement of no or very low leakage current, e.g., $2 \times 10^{-7}$ amperes maximum, is expected for a passivated device having, at worst, a latent defect in the passivant.

The chamber 130 is then rendered humid, via conduit 156, to a predetermined value, within the range of 30 to 100 percent relative humidity, preferably substantially 100%. The current is then measured by recorder 140. A measurement of current greater than the dry environment reading is an indication of a humidity-induced leakage current. A high value of this humidity-induced leakage current is indicative of a defect in the passivant 29.

It is believed that a high value of humidity-induced leakage current, e.g. 10 times that in a dry ambient, is caused by a mixture of ionic current activity in the defect, such as a pinhole 37 (shown by dotted line in FIG. 1) passing through layer 36 and nearly through glass layer 34, as well as electron flow through the SIPOS passivant layer 30. This large ionic and electronic current is caused by (i) an abnormally high electric field present in the neighborhood of the defect when the p-n junction 17 is reversed biased and (ii) the presence of high humidity. Note that a very high net increase in leakage current will occur if and only if both conditions (i) and (ii) are present. Therefore, if one places the device in a high humidity ambient and observes a large increase in leakage current, the presence of one or more such defects is indicated.

A pinhole 37 existing in the passivant 29 having a depth of about 19 micrometers into the 20 micrometer thick glass layer 34 will be identified, for example, as a "humidity-sensitive pinhole." However, a similar pinhole extending only to 10 micrometers into layer 34 will not induce an excessive leakage current. Nevertheless, such a "shallow" pinhole would not cause an otherwise acceptable device to fail subsequently in actual operation. Thus, the method of the invention identifies defects that would in subsequent tests or in actual operation cause a failure mode of the device. Accordingly, the term "humidity-induced leakage current" is used herein to identify such defects.

Figure 3:
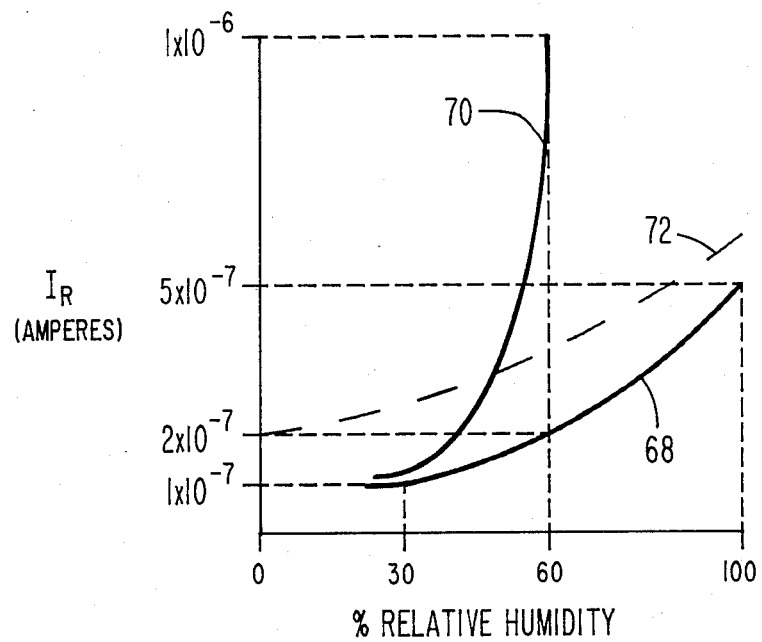
FIG. 3 is a representative plot of leakage current ($I_R$) vs. the percent relative humidity.

A representative plot of the leakage current ($I_R$) as a function of relative humidity will show that devices that have, for example, leakage between $1\times10^{-7}$ amps to $2\times10^{-7}$ amps for relative humidity changes of 30 to 60 percent will be acceptable for a typical $100\times100$ mil$^2$ device chip. Such a range of acceptable devices is shown by curve 68 in FIG. 3. The magnitude of leakage will be typically proportional to the chip area. Therefore, a larger chip would provide a larger leakage current. Accordingly, FIG. 3 is merely representative of the kinds of data one can expect. It is the amount of change in the leakage which is of much greater significance than the absolute leakage current values.

Defects are usually considered in practice as a statistical event. Depending on the degree of confidence one wants, one can usually test only a few chips from a few wafers (out of typically 100 wafers from a production run) and draw some conclusion as to the acceptability of the entire lot of 100 wafers. This is a decision to be made jointly with the quality control manager, for example.

On the other hand, devices that are known to be unacceptable and are therefore rejected would have a range of values of current leakage vs. percent relative humidity as depicted by curve 70 of from about $1\times10^{-7}$ amps to $1\times10^{-6}$ amps or higher for the same humidity changes, namely 30 to 60 percent relative humidity. Typically, an increase of ten times or larger in leakage current in a humid environment can be expected to identify a defective passivant. We have determined from such data that an acceptance curve 72 can be generated as a function of leakage current variations versus relative humidity. Curve plots of the type shown in FIG. 3 are then useful to provide to recorder 140, that is suitably microprocessor controlled, such that devices 10 can be quickly tested in the apparatus shown in FIG. 2 to determine acceptance or rejection criteria for a given relative humidity and bias voltage.

Figure 4:
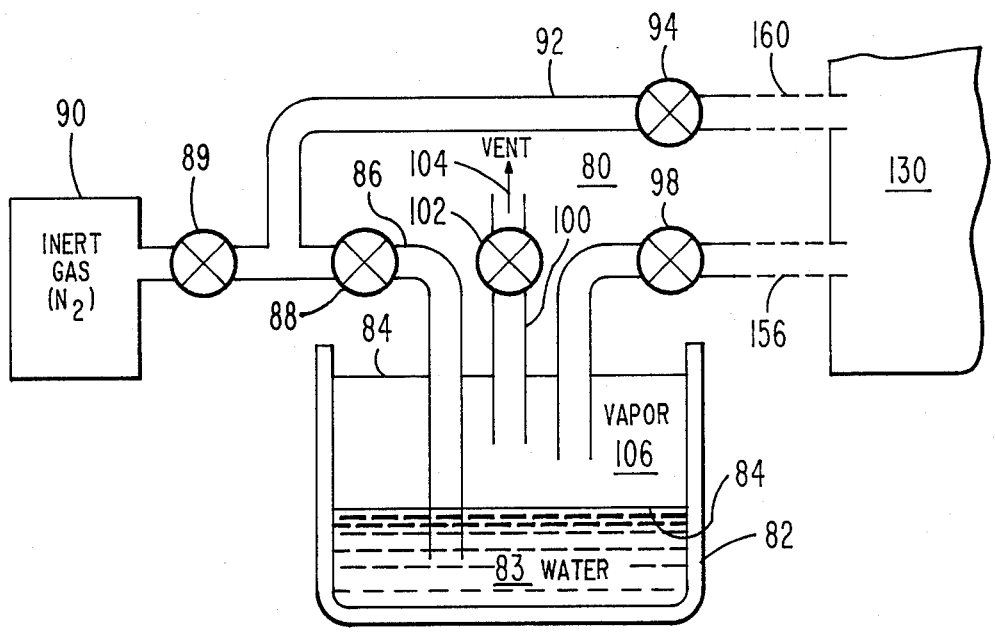
FIG. 4 is a schematic of a controlled source of water vapor useful as an alternative to the source of FIG. 2.

An apparatus 80, serving as an alternative to the water vapor source 152 and nitrogen source 158 of FIG. 2, for providing the desired degree of relative humidity, is shown in FIG. 4. The apparatus 80 comprises a closed tank 82 having an upper closure member 84 for receiving three conduits. The container 82 is provided with water 83 to a level 84 sufficient to cover the opening of conduit 86. Conduit 86 is connected to valves 88 and 89 and thence to a source 90 of inert gas, such as nitrogen. A bipass conduit 92 is provided with a valve control 94 for passing gas from source 90 directly to chamber 130 via inlet conduit 160 with valves 88 and 98 closed. A conduit 100 under control of a valve 102 provides a vent as indicated by arrow 104 from the chamber above the water level 84. Gas from source 90, when passed into the water, develops a vapor to accumulate above the surface 84 in the portion 106. The vapor is conducted through the conduit 156 into the chamber 130. The desired degree of relative humidity of the vapor discharged into chamber 130 is achieved by controlling the amount of gas from chamber 90 that is passed into the water 83.

In the alternative, for faster automatic measurements, one can choose two humidity levels, for example 0 percent and 80 percent, and measure the corresponding leakage currents at a given bias voltage 136. The ratio of the respective leakage currents at the respective relative humidities is then used to screen a device for acceptance. For example, if the value of the ratio for acceptance is 2, then a device is rejected for ratios greater than 2 and accepted for ratios equal to or less than 2. Moreover, more than one bias voltage 36 can be used simultaneously in the same sequence of measurements to tighten the specifications of acceptability.

As indicated above, a single measurement of leakage current at, for example, 100% humidity may be adequate for pass-fail tests of devices.

The process of the invention is preferably done after the last layer 36 of a multi-layer passivant is applied, for example. However, the process can be used following any passivation layer deposited.

The method of the present invention provides a sensitive test to determine specifically the integrity of a passivant applied to a device after the device is known to be satisfactorily operable prior to the application of passivants. By this method the device can be evaluated before more costly and non-reversible steps are performed. The method is different from prior art methods by which a device is subjected to conventional humidity environment tests for determining undesired leakage currents or, indeed, outright failure of operation of the device due to the humidity. None of these prior art environmental methods, however, specifically identify humidity-induced defects in the passivant.

For example, one test that is conventionally used in the art on packaged devices is a high temperature reversed bias (HTRB) test. Such a test is performed on a device both before and after it has been placed in a high temperature environment of, for example, 150° C. for 24 hours at 80% of the rated reverse bias voltage. If the environment is humidified, the test is known as the "bias-humidity" test. Both of these tests done at atmospheric pressure detects leakage in a packaged device but cannot identify whether the leakage is due to the passivant.

A "pressure cooker" test done with 100% humidity in a sealed chamber and raised pressure by increased temperature produce defects due to ion contamination and very little, if any, due to passivant defects. Such "pressure cooker" tests are not done with electrical connections to the device. Moreover, the leakage currents measured after the device is removed from the high humidity, high pressure "pressure cooker" environment are permanent since the current flow increases, as compared to current flow measurements made on the device before it was put to the environment are induced by physical or chemical changes, or both, in the device materials.

It should now be appreciated that the process of the invention is non-destructive to the device. The humidity-induced leakage current measured while the device is in the humid environment is used to identify defects in the passivant coverage. If such a defect is discovered by the process of the invention, the defective device can be de-humidified and returned for reprocessing the defective passivant if desired.

It should be further appreciated that the method of the invention allows one to determine whether or not a passivant has a defect which could become detrimental to device operation or lifetime. Many defects may exist in the passivant, but may never be exposed to high electric fields and, accordingly, will not be identified by the use of this invention. It should be quite apparent that such defects are not at all important to device operation.

What is claimed is:

1. A method for determining the integrity of passivant coverage over a rectifying junction in a semiconductor device as manifested by humidity-induced leakage current, said device having passed a test of operability prior to passivation, comprising the steps of:
   passivating the junction of said device with at least one layer of passivant material,
   providing a reverse bias voltage at a predetermined value across said junction,
   exposing the passivated device initially to a dry environment of substantially zero percent humidity while determining in said dry environment the reverse biased current flow through said device at said zero percent humidity,
   thereafter exposing the device to a humid environment of predetermined relative humidity while determining in said humid environment the reverse biased current flow through said device and said junction; and
   comparing the value of the respective currents to determine the integrity of the passivant, a defective passivant being manifested by a larger reverse biased current flow for said humid environment than the reverse biased current flow for said dry environment.

2. The method of claim 1 further comprising the step of exposing said device to a dry environment subsequent to said comparison step to verify that said passivant defect is humidity-induced by again repeating the current flow measurement as would be manifested by a reduction in the current flow as compared to the humidity induced current flow to a value substantially equal to said first measured current flow in the first measured dry environment step.

3. The method of claim 1 wherein said humidity exposing step comprises a humidity at a selected value between 30 to 100 percent relative humidity.

4. The method of claim 1 wherein the dry environment exposing step comprises exposing said device to an ambient of nitrogen to provide substantially zero percent relative humidity.

5. The method of claim 1 wherein the step of passivating the surface of said device includes passivating said junction in one or more steps of layering passivant material and determining the respective leakage currents following any one of such passivant layering steps.

6. The method of claim 1 comprising the step of passivating the surface of said device, including exposed portions of said junction, with SIPOS.

7. The method of claim 1 comprising the step of passivating the surface of said device, including exposed portions of said junction, with SOGO.

8. The method of claim 1 wherein said reverse bias voltage is at least 80% of the rated reverse bias voltage of the device.

* * * * *